(12) United States Patent
Li et al.

(10) Patent No.: US 11,705,461 B2
(45) Date of Patent: Jul. 18, 2023

(54) DISPLAY SUBSTRATE, MANUFACTURING METHOD THEREOF, DISPLAY PANEL AND DISPLAY DEVICE

(71) Applicant: BOE Technology Group Co., Ltd., Beijing (CN)

(72) Inventors: Dong Li, Beijing (CN); Yang Yu, Beijing (CN); Huijuan Zhang, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 43 days.

(21) Appl. No.: 17/357,347

(22) Filed: Jun. 24, 2021

(65) Prior Publication Data

US 2022/0139968 A1 May 5, 2022

(30) Foreign Application Priority Data

Nov. 3, 2020 (CN) .......................... 202011212622.2

(51) Int. Cl.
*H01L 27/12* (2006.01)
*H10K 59/121* (2023.01)

(52) U.S. Cl.
CPC ...... *H01L 27/1229* (2013.01); *H01L 27/1225* (2013.01); *H01L 27/1251* (2013.01); *H01L 27/1255* (2013.01); *H01L 27/1259* (2013.01); *H10K 59/1213* (2023.02)

(58) Field of Classification Search
CPC ............ H01L 27/1229; H01L 27/1225; H01L 27/1251; H01L 27/1255; H01L 27/1259; H01L 27/3262; H10K 59/1213; H10K 59/12; H10K 59/123; H10K 59/65; H10K 59/80; H10K 59/1216

See application file for complete search history.

(56) References Cited

U.S. PATENT DOCUMENTS

| | | | |
|---|---|---|---|
| 8,421,090 B2 * | 4/2013 | Choi ................... | H01L 27/1251 257/79 |
| 9,653,609 B2 * | 5/2017 | Yoo ................... | H01L 29/78648 |
| 11,289,649 B2 * | 3/2022 | Leong ................... | H01L 45/144 |

(Continued)

FOREIGN PATENT DOCUMENTS

| CN | 102013432 A | 4/2011 |
|---|---|---|
| CN | 107078135 A | 8/2017 |

(Continued)

OTHER PUBLICATIONS

CN202011212622.2 first office action.
CN202011212622.2 second office action.

*Primary Examiner* — Nikolay K Yushin
(74) *Attorney, Agent, or Firm* — IPro, PLLC

(57) ABSTRACT

Disclosed are a display substrate, a manufacturing method thereof, a display panel and a display device. The display panel comprises: a base substrate provided with a first area and a second area which are not overlapped with each other; a low temperature poly-silicon transistor arranged in the first area, the low temperature poly-silicon transistor comprises a poly-silicon active layer; an oxide transistor arranged in the second area, the oxide transistor comprises a first gate electrode; the first gate electrode is arranged in a same layer as the poly-silicon active layer, and a material of the first gate electrode is heavily-doped poly-silicon.

13 Claims, 5 Drawing Sheets

(56) References Cited

U.S. PATENT DOCUMENTS

| | | | |
|---|---|---|---|
| 2008/0073654 A1 | 3/2008 | Miyake et al. | |
| 2011/0049507 A1 | 3/2011 | Choi | |
| 2015/0243220 A1 | 8/2015 | Kim et al. | |
| 2016/0155858 A1* | 6/2016 | Yoo | H01L 29/78696 |
| | | | 257/66 |
| 2018/0151654 A1 | 5/2018 | Lee | |
| 2020/0295052 A1 | 9/2020 | Hideo | |
| 2021/0320249 A1* | 10/2021 | Leong | H01L 45/145 |
| 2022/0140114 A1* | 5/2022 | Jang | H01L 29/401 |
| | | | 438/510 |

FOREIGN PATENT DOCUMENTS

| | | |
|---|---|---|
| CN | 107863354 A | 3/2018 |
| CN | 108122928 A | 6/2018 |
| CN | 109300915 A | 2/2019 |
| CN | 110098201 A | 8/2019 |
| KR | 20150101414 A | 9/2015 |
| WO | 2017210926 A1 | 12/2017 |

* cited by examiner

S301 — Providing the base substrate, the base substrate comprises the first area and the second area, and the first area and the second area are not overlapped with each other S302 — Forming the poly-silicon active layer of the low temperature poly-silicon transistor in the first area; and forming the first gate electrode of the oxide transistor in the second area

DISPLAY SUBSTRATE, MANUFACTURING METHOD THEREOF, DISPLAY PANEL AND DISPLAY DEVICE

CROSS-REFERENCE OF RELATED APPLICATIONS

The present application claims the priority of Chinese Patent Application No. 202011212622.2, filed with the China National Intellectual Property Administration on Nov. 3, 2020 and entitled "Display Substrate, Manufacturing Method Thereof, Display Panel and Display Device" the entire contents of which are incorporated herein by reference.

FIELD

The present disclosure relates to the technical field of display, in particular to a display substrate, a manufacturing method thereof, a display panel and a display device.

BACKGROUND

With the continuous development of display technology, the requirements of people on resolution, power consumption and picture quality of display products are getting higher and higher. To meet these requirements, low temperature polycrystalline-oxide (LTPO) technology is often adopted to manufacture a pixel drive circuit in a drive backplane of a display product, and the LTPO technology is namely simultaneously using both low temperature poly-silicon thin film transistor (LTPS TFT) and metal oxide thin film transistor (Oxide TFT) as functional transistor in the pixel drive circuit. Since the mobility of LTPS TFT is high, the charging speed of pixel capacitors can be sped up, and the oxide TFT has lower leakage currents. A combination of the advantages of these two types of transistors contributes to the development of display products with high resolution, low power consumption, and high picture quality.

SUMMARY

Embodiments of the present disclosure provide a display substrate, a manufacturing method thereof, a display panel and a display device.

In a first aspect, a display substrate provided in embodiments of the present disclosure includes:

a base substrate, the base substrate includes a first area and a second area which are not overlapped with each other;

a low temperature poly-silicon transistor arranged in the first area, the low temperature poly-silicon transistor includes a poly-silicon active layer; and an oxide transistor arranged in the second area, the oxide transistor includes a first gate electrode, the first gate electrode is arranged in the same layer as the poly-silicon active layer, and a material of the first gate electrode is heavily-doped poly-silicon.

In some embodiments, the low temperature poly-silicon transistor further includes: a second gate electrode, a first source electrode and a first drain electrode; the second gate electrode, the first source electrode, and the first drain electrode are sequentially disposed on a side, facing away from the base substrate, of the poly-silicon active layer; the first source electrode and the first drain electrode are electrically connected with the poly-silicon active layer; and the oxide transistor further includes: an oxide active layer arranged between a layer where the second gate electrode is located and a layer where the first source electrode and the first drain electrode are located, a third gate electrode arranged between the oxide active layer and the layer where the first source electrode and the first drain electrode are located, and a second source electrode and a second drain electrode, which are arranged in a same layer as the first source electrode and the first drain electrode; the second source electrode and the second drain electrode are electrically connected with the oxide active layer.

In some embodiments, the oxide transistor further includes: a first gate insulating layer arranged between the layer where the first gate electrode is located and the layer where the oxide active layer is located, a second gate insulating layer arranged between the layer where the oxide active layer is located and the layer where the third gate electrode is located, and an interlayer insulating layer arranged between the layer where the oxide active layer is located and the layer where the second source electrode and the second drain electrode are located; and the first source electrode and the first drain electrode are electrically connected with the poly-silicon active layer through a first via hole which penetrates through the first gate insulating layer, the second gate insulating layer and the interlayer insulating layer, and the second source electrode and the second drain electrode are electrically connected with the oxide active layer through a second via hole which penetrates through the second gate insulating layer and the interlayer insulating layer; the first via hole and the second via hole are formed in a same process.

In some embodiments, the base substrate further includes a third area; the third area is not overlapped with either the first area or the second area, the third area is provided with a capacitor, and the capacitor includes a first electrode arranged in the same layer as a layer where the second gate electrode is located, and a second electrode arranged in the same layer as a layer where the third gate electrode is located.

In some embodiments, the display panel further includes: a planarization layer, a plurality of anodes and a pixel defining layer;

the planarization layer, the plurality of anodes, and the pixel defining layer are arranged in sequence on the side, facing away from the base substrate, of the layer where the first source electrode and the first drain electrode are located;

the pixel defining layer is provided with a plurality of pixel openings, and each of the plurality of pixel openings is correspondingly internally provided with a respective one of the plurality of anodes; and each of the plurality of anodes is correspondingly electrically connected with the first drain electrode through a third via hole which penetrates through the planarization layer.

In some embodiments, the oxide transistor is a switch transistor and the low temperature poly-silicon transistor is a drive transistor.

In a second aspect, embodiments of the present disclosure further provide a manufacturing method of the above display panel, including:

providing a base substrate, the base substrate includes a first area and a second area which are not overlapped with each other; and forming a poly-silicon active layer of the low temperature poly-silicon transistor in the first area;

forming a first gate electrode of the oxide transistor in the second area;

the material of the first gate electrode is heavily-doped poly-silicon.

In some embodiments, the forming a poly-silicon active layer of the low temperature poly-silicon transistor in the first area and forming a first gate electrode of the oxide transistor in the second area specifically includes:

forming an amorphous silicon layer on the base substrate;

performing laser annealing treatment on the amorphous silicon layer to form a poly-silicon layer;

patterning the poly-silicon layer to form a first poly-silicon located in the first area and a second poly-silicon located in the second area;

performing a first ion injection on an intermediate area of the first poly-silicon, to form a channel area in the intermediate area of the first poly-silicon;

performing a second ion injection on both edge areas of the first poly-silicon and the second poly-silicon, to form heavily-doped areas in the edge areas of the first poly-silicon and in the second poly-silicon; and the poly-silicon active layer of the low temperature poly-silicon transistor is composed of the first poly-silicon after the first ion injection and the second ion injection; and the first gate electrode of the oxide transistor is composed of the second poly-silicon after the second ion injection.

In some embodiments, after forming a poly-silicon active layer of the low temperature poly-silicon transistor in the first area, and forming a first gate electrode of the oxide transistor in the second area, the method further includes:

on the layer where the poly-silicon active layer is located, forming in sequence a first gate insulating layer set for a whole surface, a second gate electrode of the low temperature poly-silicon transistor in the first area, an oxide active layer of the oxide transistor in the second area, a second gate insulating layer set for a whole surface, a third gate electrode of the oxide transistor in the second area, and an interlayer insulating layer set for a whole surface;

forming, using one patterning process, a first via hole penetrating through the first gate insulating layer, the second gate insulating layer and the interlayer insulating layer, and a second via hole penetrating through the second gate insulating layer and the interlayer insulating layer; wherein the first via hole exposes a part of the poly-silicon active layer and the second via hole exposes a part of the oxide active layer; and on the interlayer insulating layer, forming a first source electrode and a first drain electrode of the low temperature poly-silicon transistor in the first area, and a second source electrode and a second drain electrode of the oxide transistor in the second area.

In some embodiments, while forming the second gate electrode of the low temperature poly-silicon transistor in the first area, the method further comprises: forming a first electrode of a capacitor in a third area, the third area is not overlapped with both the first area and the second area; and while forming the third gate electrode of the oxide transistor in the second area, the method further comprises: forming a second electrode of the capacitor in the third area.

In a third aspect, embodiments of the present disclosure provide a display panel, including the display substrate provided in any of the above embodiments.

In a fourth aspect, embodiments of the present disclosure provide a display device, including the display panel provided in any of the above embodiments.

DETAILED DESCRIPTION OF THE EMBODIMENTS

Figure 1:
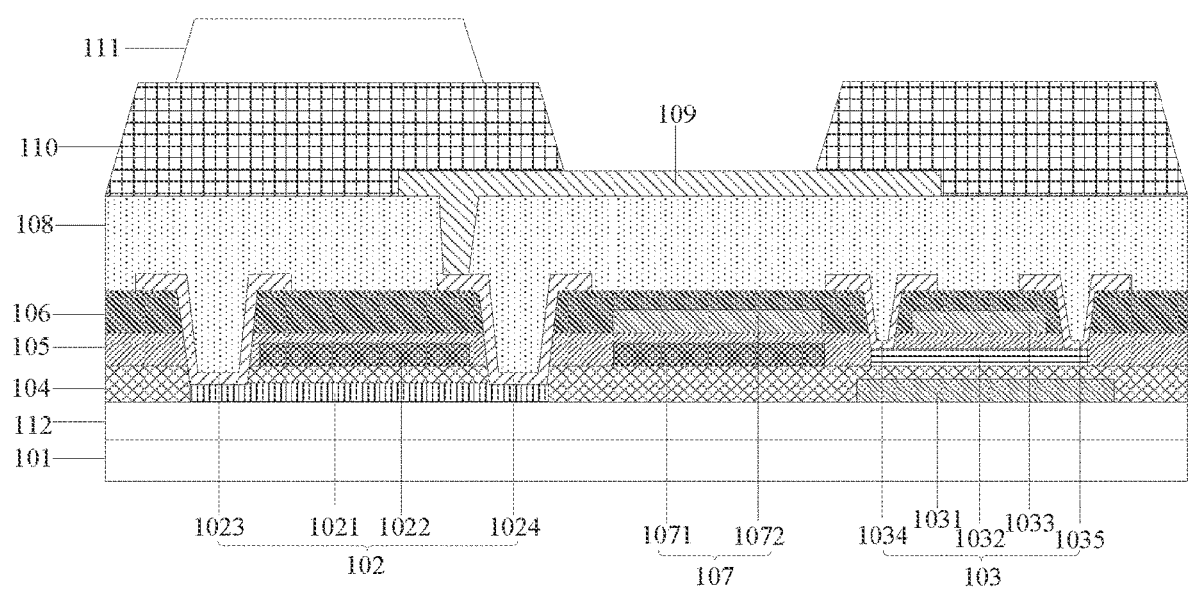
FIG. 1 is a structural schematic diagram of a display substrate provided in embodiments of the present disclosure.

In order to make the objectives, technical solutions, and advantages of embodiments of the present disclosure clearer, the technical solutions of embodiments of the present disclosure will be described clearly and completely below in combination with accompanying drawings of embodiments of the present disclosure. It should be noted that, the size and shape of each graphic in the accompanying drawings do not reflect true proportions, merely aiming at schematically illustrating the content of the present disclosure. Moreover, the same or similar reference numerals throughout the text represent the same or similar elements or the element with the same or similar functions. Apparently, the described embodiments are only a part but not all of embodiments of the present disclosure. Based upon the described embodiments of the present disclosure, all of the other embodiments obtained by those skilled in the art without any creative effort shall all fall within the protection scope of the present disclosure.

Unless otherwise defined, the technical or scientific terms used in the present disclosure shall have a general meaning understood by those skilled in the art to which the present disclosure belongs. The terms "first", "second" and the like used in the specification and claims of the present disclosure do not indicate any order, quantity, or importance, but are merely intended to distinguish different components. Words like "include" or "comprise" mean that the element or object preceding the word covers the element or object listed after the word and its equivalent, without excluding other elements or objects. Terms like "inner", "outer", "upper" and "lower" are merely intended to represent the relative position relationship, and when the absolute position of the described object changes, the relative positional relationship may also change correspondingly.

The organic light emitting diode, OLED, display technology is different from the traditional liquid crystal display, LCD, the OLED does not need a backlight, but adopts organic light emitting materials, when a current passes through, these organic light emitting materials will emit light. By adopting a very thin coating of organic materials, OLED displays can be manufactured lighter and thinner, and OLED displays have a larger viewing angle and can significantly save electric energy.

In related technologies, mainstream OLED displays are mainly driven by LTPS backplane, i.e., the transistors in the pixel drive circuit are all LTPS TFTs, while compared with the display products purely provided with LTPS TFTs, the display products provided with both LTPS TFTs and Oxide TFTs at least need to be added with a gate electrode of oxide TFT, an oxide active layer of oxide TFT, and a gate insulating layer between the gate electrode of oxide TFT and the oxide active layer of oxide TFT, therefore, more film layers are stacked, and too many film layers are prone to causing cracks due to stress mismatch in the film layers, thereby resulting in failure of transistors.

Aiming at the above problem existing in the related art, embodiments of the present disclosure provide a display substrate, as shown in FIG. 1, the display substrate may include:

a base substrate 101, the base substrate 101 includes a first area and a second area, and the first area and the second area are not overlapped with each other;

a low temperature poly-silicon transistor 102, arranged in the first area, the low temperature poly-silicon transistor 102 includes a poly-silicon active layer 1021; and an oxide transistor 103 arranged in the second area, the oxide transistor 103 includes a first gate electrode 1031; the first gate electrode 1031 is arranged in the same layer as the poly-silicon active layer 1021, and a material of the first gate electrode 1031 is heavily-doped poly-silicon.

In the above display substrate provided in embodiments of the present disclosure, the first gate electrode 1031 of the oxide transistor 103 is manufactured by using a heavily-doped poly-silicon, so that the poly-silicon active layer 1021 of the low temperature poly-silicon transistor 102 and the first gate electrode 1031 of the oxide transistor 103 can be set in the same layer, thereby avoiding the need of separately setting a film layer where the first gate electrode 1031 of the oxide transistor 103 is located, reducing the number of stacked layers contained in the display substrate which is provided with a low temperature poly-silicon transistor 102 and an oxide transistor 103, lowering the risk of failure of the LTPO transistor due to cracks caused by stress mismatch in the film layer, and improving the product yield.

It should be understood that in the present disclosure, "the same layer" refers to a layer structure formed by using the same film forming process to form a film layer for preparing a graphic, and then formed using the same mask through one patterning process. That is, one patterning process corresponds to one mask (also called photo-mask). Depending on difference in graphics, one patterning process may include multiple exposure, development or etching processes; and the graphics in the formed layer structure may be continuous or discontinuous, and these graphics may also be at different heights or have different thicknesses.

In some embodiments, as shown in FIG. 1, the low temperature poly-silicon transistor 102 may further include: a second gate electrode 1022, a first source electrode 1023 and a first drain electrode 1024; the second gate electrode 1022, the first source electrode 1023, and the first drain electrode 1024 are sequentially disposed on the side, facing away from the base substrate 101, of the layer where the poly-silicon active layer 1021 is located; the first source electrode 1023 and the first drain electrode 1024 are electrically connected with the poly-silicon active layer 1021; and the oxide transistor 103 may further include:

an oxide active layer 1032 arranged between the layer where the second gate electrode 1022 is located and the layer where the first source electrode 1023 and the first drain electrode 1024 are located;

a third gate electrode 1033 arranged between the oxide active layer 1032 and the layer where the first source electrode 1023 and the first drain electrode 1024 are located; and a second source electrode 1034 and a second drain electrode 1035, which are arranged in the same layer as the first source electrode 1023 and the first drain electrode 1024;

the second source electrode 1034 and the second drain electrode 1035 are electrically connected with the oxide active layer 1033.

Of course, in some embodiments, the oxide transistor 103 may also be a bottom gate transistor, i.e., the oxide transistor 103 may not include the third gate electrode 1033, which is not limited herein.

In some embodiments, as shown in FIG. 1, the oxide transistor further includes: a first gate insulating layer 104 arranged between the layer where the first gate electrode 1022 is located and the layer where the oxide active layer 1021 is located; a second gate insulating layer 105 arranged between the layer where the oxide active layer 1032 is located and the layer where the third gate electrode 1033 is located; and an interlayer insulating layer 106 arranged between the layer where the oxide active layer 1032 is located and the layer where the second source electrode 1034 and the second drain electrode 1035 are located; and the first source electrode 1023 and the first drain electrode 1024 are electrically connected with the poly-silicon active layer 1021 through a first via hole which penetrates through the first gate insulating layer 104, the second gate insulating layer 105 and the interlayer insulating layer 106; the second source electrode 1034 and the second drain electrode 1035 are electrically connected with the oxide active layer 1031 through a second via hole which penetrates through the second gate insulating layer 105 and the interlayer insulating layer 106; and the first via hole and the second via hole are formed in a same process.

Since fewer film layers are stacked in the present disclosure, therefore, the first via hole which electrically connects the first source electrode 1023 and the first drain electrode 1024 with the poly-silicon active layer 1021 and the second via hole which electrically connects the second source electrode 1034 and the second drain electrode 1035 with the oxide active layer 1031 can be formed by a single patterning process. Compared to the related technology where two patterning processes are adopted to respectively form the first via hole which electrically connects the first source electrode 1023 and the first drain electrode 1024 with the poly-silicon active layer 1021 and the second via hole which electrically connects the second source electrode 1034 and the second drain electrode 1035 with the oxide active layer 1031, one punching process can be saved in the present disclosure.

In some embodiments, as shown in FIG. 1, the base substrate 101 may also include a third area which is not overlapped with either the first area or the second area, and the third area is provided with a capacitor 107, the capacitor 107 includes a first electrode 1071 arranged in the same layer as the layer where the second gate electrode 1022 is located, and a second electrode 1072 arranged in the same layer as the layer where the third gate electrode 1033 is located. By setting the two electrodes of the capacitor 107 respectively in the same layer as the second gate electrode 1022 and the third gate electrode 1033. Therefore, it is possible to prevent the electrodes of the capacitor 107 from occupying a single layer, thereby reducing the stacking of film layers, and simplifying the manufacturing process.

In some embodiments, as shown in FIG. 1, the above display substrate provided in the embodiment of the present disclosure may generally also include: a planarization layer 108, a plurality of anodes 109 and a pixel defining layer 110; the planarization layer 108, the plurality of anodes 109, and the pixel defining layer 110 are arranged in sequence on the side, facing away from the base substrate 101, of the layer where the first source electrode 1023 and the first drain electrode 1024 are located;

the pixel defining layer 110 is provided with a plurality of pixel openings, and each of the plurality of pixel openings is correspondingly internally provided with a respective one of the plurality of anodes 109; and each of the plurality of anodes 109 is correspondingly electrically connected with the first drain electrode 1024 through a third via hole which penetrates through the planarization layer 108.

In some embodiments, for better applicability to display products with high resolution, low power consumption, and high picture quality, in the above display substrate provided in embodiments of the present disclosure, the oxide transistor may be a switch transistor and the low temperature poly-silicon transistor may be a drive transistor.

Figures 2, 3:
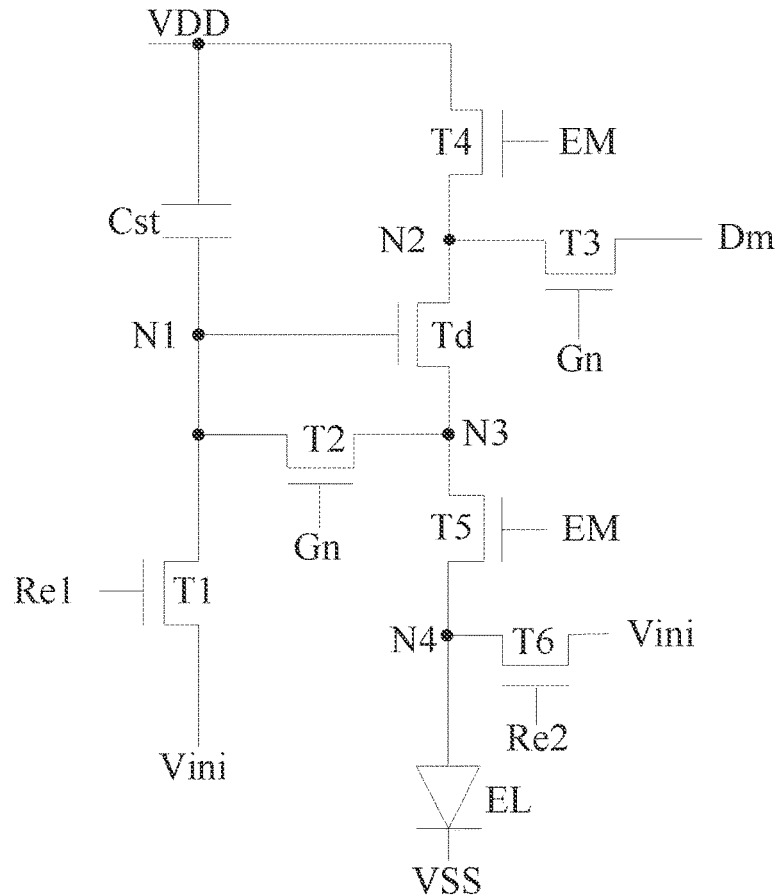
FIG. 2 is a structural schematic diagram of a pixel drive circuit in the related art.
FIG. 3 is a flow chart of a manufacturing method of a display substrate provided in embodiments of the present disclosure.

In some embodiments, FIG. 2 shows a pixel drive circuit of 7T1C structure in the related technology. The process of driving the light emitting device to emit light can be divided into the following three stages: in the first stage, the first transistor T1 is turned on under the control of the reset signal terminal Re1, such that the initialized signal terminal Vini resets the gate of the drive transistor Td (i.e., the N1 node), and the remaining transistors are in the cutoff state. In the second stage, the second transistor T2 and the third transistor T3 are turned on under the control of the scanning signal terminal Gn, and the signal of the data signal terminal Dm is written to the N2 node via the third transistor T3, and the threshold compensation of the drive transistor Td is realized via the second transistor T2; in addition, the sixth transistor T6 is turned on under the control of the second reset signal terminal Re2, such that the initialized signal terminal Vini resets the anode of the light emitting device (i.e., the N4 node), and the remaining transistors are in the cutoff state. In the third stage, under the control of the light emitting control signal terminal EM, the fourth transistor T4 and the fifth transistor T5 are turned on, at this time, the drive transistor Td is also in a turned-on state due to the presence of the storage capacitor Cst, thereby providing the drive current for the light emitting device EL.

In the pixel drive circuit shown in FIG. 2, each transistor is a low temperature poly-silicon transistor, due to the higher leakage of low temperature poly-silicon transistor, the capacitor Cst cannot be well closed, which is especially obvious in the low-frequency display technology. In the present disclosure, when the first transistor T1 and the second transistor T2 are set to be oxide transistors with low leakage, and the other transistors are still low temperature poly-silicon transistors, the above problem can be well solved.

Based on the same inventive concept, embodiments of the present disclosure provide a manufacturing method of a display substrate, and since the principle based on which the manufacturing method solves problems is similar to the principle based on which the above display substrate solves problems, therefore, for the implementation of the manufacturing method provided in embodiments of the present disclosure, please refer to the implementation of the above display substrate provided in embodiments of the present disclosure, and the same parts will not be repeated redundantly herein.

In some embodiments, as shown in FIG. 3, the manufacturing method includes the following steps:

S301, providing a base substrate, the base substrate includes a first area and a second area which are not overlapped with each other; and S302, forming a poly-silicon active layer of the low temperature poly-silicon transistor in the first area, and forming a first gate electrode of the oxide transistor in the second area, the material of the first gate electrode is heavily-doped poly-silicon.

In order to better understand the manufacturing method of the above display substrate provided in the present disclosure, the manufacturing process of the display substrate shown in FIG. 1 is described in detail below.

Figure 4:
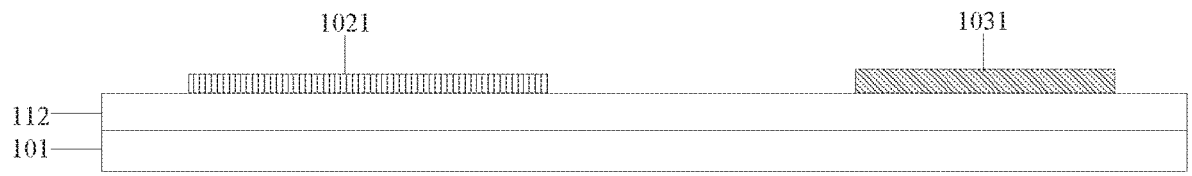
FIG. 4 to FIG. 12 are respectively structural schematic diagrams of a display substrate provided in embodiments of the present disclosure in the manufacturing process.

Step 1: As shown in FIG. 4, after forming a buffer layer 112 set for a whole surface on the base substrate 101, forming an amorphous silicon layer on the buffer layer 112, and performing laser annealing treatment on the amorphous silicon layer to form a poly-silicon layer; patterning the poly-silicon layer to form a first poly-silicon in the first area, and a second poly-silicon in the second area; performing the first ion (e.g., B ion) injection on the middle area of the first poly-silicon to form a channel area in the middle area of the first poly-silicon; performing a second ion injection (e.g., P ion) on both edge areas of the first poly-silicon and on the second poly-silicon to form a heavily-doped area in the edge areas of the first poly-silicon and in the second poly-silicon; constituting a poly-silicon active layer 1021 of the low temperature poly-silicon transistor 102 through the first poly-silicon after the first ion injection and the second ion injection, and constituting a first gate electrode 1031 of the oxide transistor 103 through the second poly-silicon after the second ion injection. Generally, a high-temperature annealing process may be used to activate the ions after each ion injection, and optionally, the annealing temperature may be 400° C. to 600° C., and the annealing time may be 300 min-1200 min.

Figure 5:
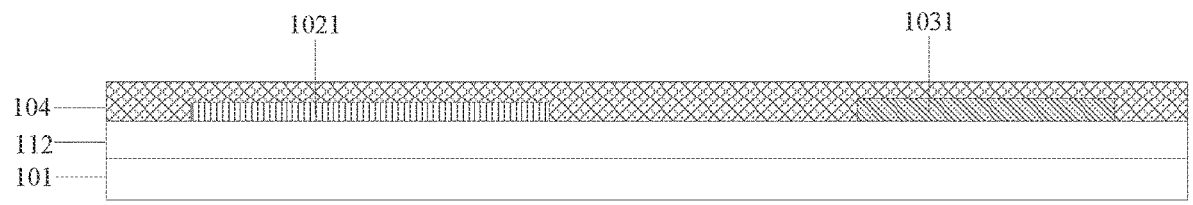

Step 2, as shown in FIG. 5, forming a first gate insulating layer 104 set for a whole surface on the layer where the poly-silicon active layer 1021 is located.

Figure 6:
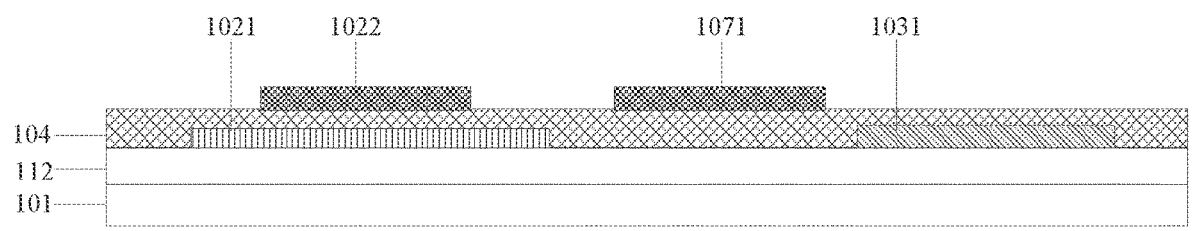

Step 3, as shown in FIG. 6, forming on the first gate insulating layer 104 a second gate electrode 1022 of a low temperature poly-silicon transistor 102 located in the first area and a first electrode 1071 of a capacitor 107 located in the third area.

Figure 7:
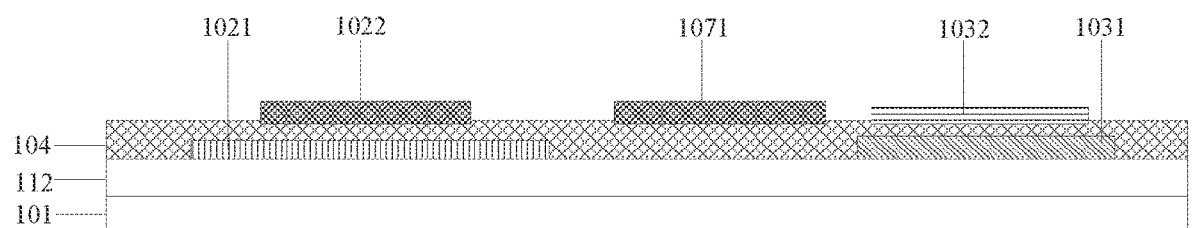

Step 4, as shown in FIG. 7, forming on the layer where the second gate electrode 1022 is located an oxide active layer 1032 of the oxide transistor 103 in the second area.

Figure 8:
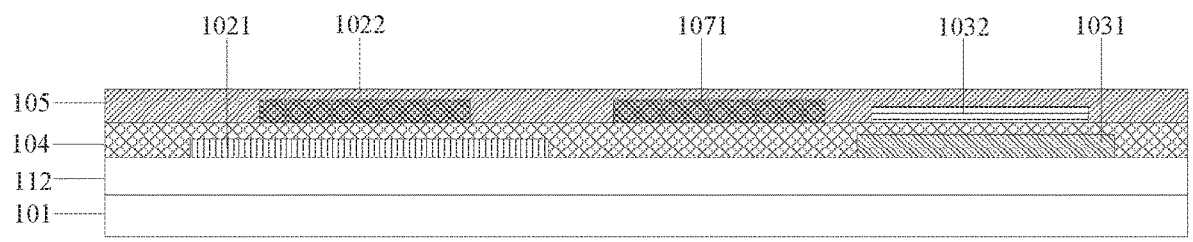

Step 5, as shown in FIG. 8, forming a second gate insulating layer 105 set for a whole surface on the oxide active layer 1032.

Figure 9:
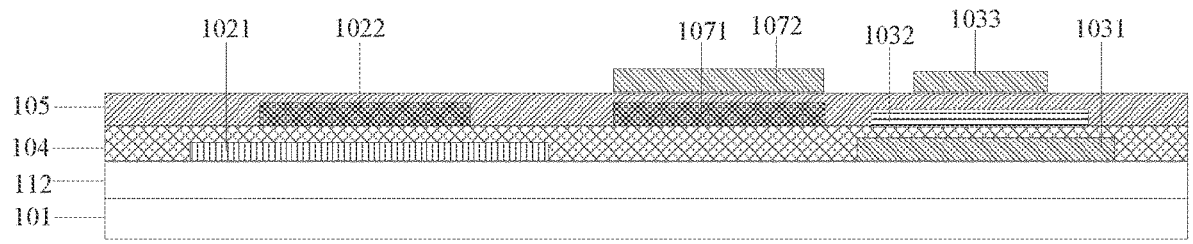

Step 6, as shown in FIG. 9, forming a third gate electrode 1033 of the oxide transistor 103 in the second area, and forming a second electrode 1072 of the capacitor 107 in the third area.

Figure 10:
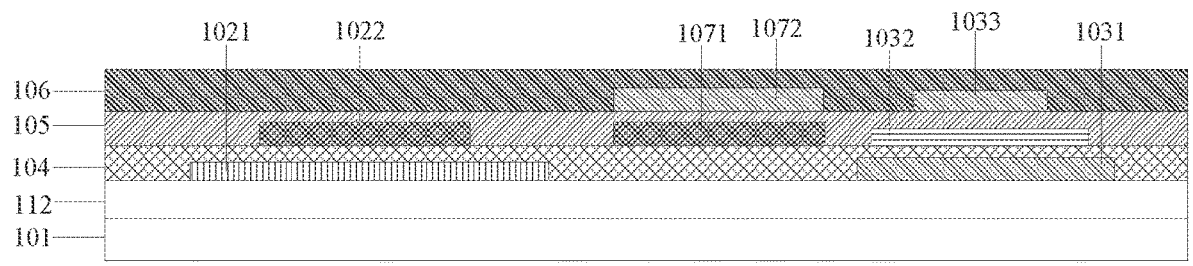

Step 7, as shown in FIG. 10, forming an interlayer insulating layer 106 set for a whole surface on the layer where the third gate electrode 1033 is located.

Figure 11:
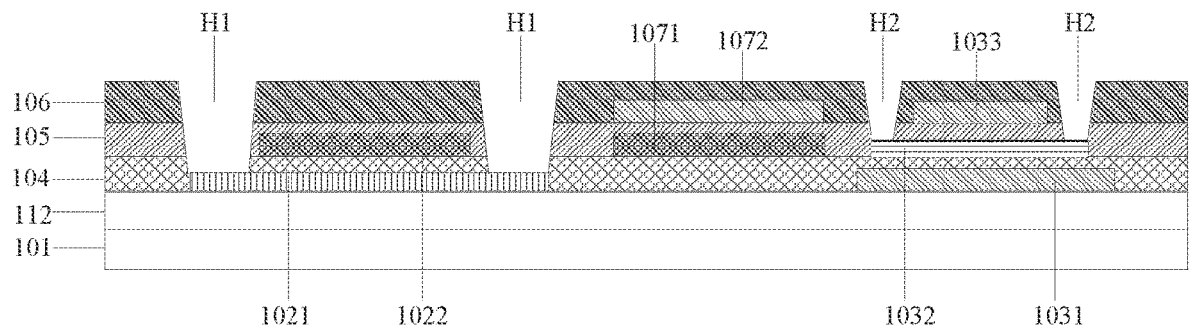

Step 8, as shown in FIG. 11, forming, using one patterning process, a first via hole H1 penetrating through the first gate insulating layer 104, the second gate insulating layer 105 and the interlayer insulating layer 106, and a second via hole H2 penetrating through the second gate insulating layer 105 and the interlayer insulating layer 106; wherein the first via hole 141 exposes part of the poly-silicon active layer 1021 and the second via hole H2 exposes part of the oxide active layer 1032.

Figure 12:
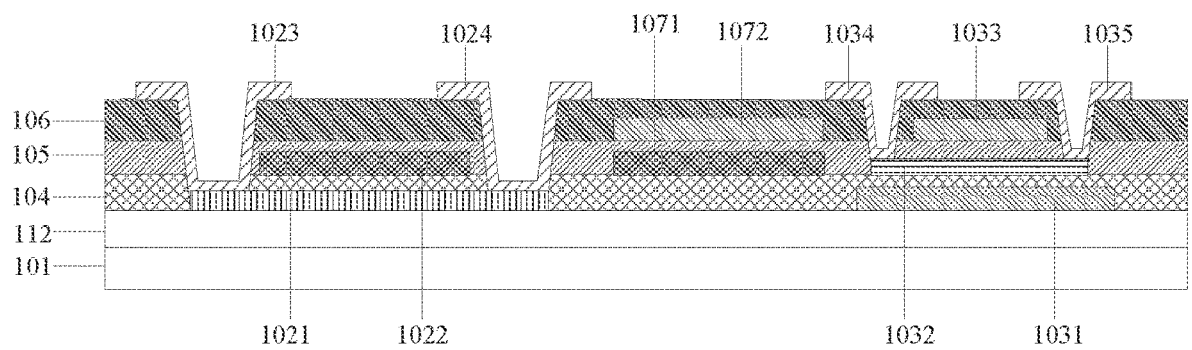

Step 9, as shown in FIG. 12, on the interlayer insulating layer 106, forming a first source electrode 1023 and a first drain electrode 1024 of the low temperature poly-silicon transistor 102 in the first area, and a second source electrode 1034 and a second drain electrode 1035 of the oxide transistor 103 in the second area.

Step 10, as shown in FIG. 1, forming in sequence a planarization layer 108 (e.g., PLN layer) with a third via hole, a plurality of anodes 110 (Anode), a pixel defining layer 109 (PDL) and a shock insulator 111 (PS layer) on the layer where the first source electrode 1023 and the first drain electrode 1024 are located.

It should be noted that in the above manufacturing method provided in embodiments of the present disclosure, the patterning process involved in forming each layer of structure may include not only some or all of the processes such as deposition, photoresist coating, mask of a mask plate, exposure, development, etching, photoresist stripping, etc., but also other processes, depending on the graphic needing a composition during the actual manufacturing process, which is not limited herein. For example, after development and before etching, a post-baking process may also be included.

The deposition process may be chemical vapor deposition, plasma-enhanced chemical vapor deposition or physical vapor deposition, which is not limited herein; the mask used in the mask process may be a half tone mask, a single slit mask or a gray tone mask, which is not limited herein; and etching may be dry etching or wet etching, which is not limited herein.

Based on the same inventive concept, embodiments of the present disclosure further provide a display panel, including the above display substrate provided in embodiments of the present disclosure.

In some embodiments, the display panel may be an organic light emitting display (OLED) panel, a quantum dot light emitting display (QLED) panel, or a micro light emitting diode display (Micro LED) panel. Since the principle based on which the display panel solves problems is similar to the principle based on which the above display substrate solves problems, therefore, for the implementation of the display panel provided in embodiments of the present invention, please refer to the implementation of the above display substrate provided in embodiments of the present invention, and the same parts will not be repeated redundantly herein.

Based on the same inventive concept, embodiments of the present disclosure further provide a display device, including the above display panel provided in embodiments of the present disclosure.

The display device may be a cell phone, a tablet computer, a television, a monitor, a notebook computer, a digital photo frame, a navigator, a smart watch, a fitness wristband, a personal digital assistant and any other products or components with a display function. Other essential components of the display device should be understood by those skilled in the art and should not be repeated redundantly herein, nor should they be used as a limitation of the present invention. In addition, since the principle based on which the display device solves problems is similar to the principle based on which the above display panel solves problems, therefore, for the implementation of the display device, please refer to embodiment of the above display panel, and the same parts will not be repeated redundantly herein.

Evidently, those skilled in the art can make various modifications and variations to the present disclosure without departing from the spirit and scope of the present disclosure. Accordingly, the present disclosure is also intended to encompass then; modifications and variations thereto so long as the modifications and variations come into the scope of the claims appended to the disclosure and their equivalents.

What is claimed is:

1. A display substrate, comprising:
   a base substrate comprising a first area and a second area;
   a low temperature poly-silicon transistor arranged in the first area; and
   an oxide transistor arranged in the second area;
   wherein the first area and the second area are not overlapped with each other;
   the low temperature poly-silicon transistor comprises a poly-silicon active layer;
   the oxide transistor comprises a first gate electrode;
   the first gate electrode is arranged in a same layer as the poly-silicon active layer; and
   a material of the first gate electrode is heavily-doped poly-silicon;
   wherein the low temperature poly-silicon transistor further comprises: a second gate electrode, a first source electrode, and a first drain electrode;
   wherein the second gate electrode, the first source electrode, and the first drain electrode are sequentially disposed on a side, facing away from the base substrate, of a layer where the poly-silicon active layer is located;
   the first source electrode and the first drain electrode are electrically connected with the poly-silicon active layer; and
   the oxide transistor further comprises: an oxide active layer, arranged between a layer where the second gate electrode is located and a layer where the first source electrode and the first drain electrode are located;
   a third gate electrode, arranged between the oxide active layer and the layer where the first source electrode and the first drain electrode are located; and
   a second source electrode and a second drain electrode, which are arranged in a same layer as the layer where the first source electrode and the first drain electrode are located;
   wherein the second source electrode and the second drain electrode are electrically connected with the oxide active layer.

2. The display substrate of claim 1, further comprising:
   a first gate insulating layer, arranged between the layer where the first gate electrode is located and a layer where the oxide active layer is located;
   a second gate insulating layer, arranged between the layer where the oxide active layer is located and a layer where the third gate electrode is located; and
   an interlayer insulating layer, arranged between the layer where the oxide active layer is located and a layer where the second source electrode and the second drain electrode are located;
   wherein the first source electrode and the first drain electrode are electrically connected with the poly-silicon active layer through a first via hole penetrating through the first gate insulating layer, the second gate insulating layer and the interlayer insulating layer;
   the second source electrode and the second drain electrode are electrically connected with the oxide active layer through a second via hole penetrating through the second gate insulating layer and the interlayer insulating layer; and
   the first via hole and the second via hole are formed in a same process.

3. The display substrate of claim 1, wherein the base substrate further comprises:
   a third area;
   wherein the third area is not overlapped with either the first area or the second area;
   the third area is provided with a capacitor;
   the capacitor comprises:

a first electrode, arranged in a same layer as the layer where the second gate electrode is located; and a second electrode, arranged in a same layer as a layer where the third gate electrode is located.

4. The display substrate of claim 1, further comprising:
a planarization layer,
a plurality of anodes, and
a pixel defining layer,
wherein the planarization layer, the plurality of anodes, and the pixel defining layer are arranged in sequence on a side, facing away from the base substrate, of the layer where the first source electrode and the first drain electrode are located;
the pixel defining layer is provided with a plurality of pixel openings, and each of the plurality of pixel openings is correspondingly internally provided with a respective one of the plurality of anodes; and
each of the plurality of anodes is correspondingly electrically connected with the first drain electrode through a third via hole penetrating through the planarization layer.

5. The display substrate of claim 1, wherein the oxide transistor is a switch transistor, and the low temperature poly-silicon transistor is a drive transistor.

6. A display panel, comprising the display substrate of claim 1.

7. The display panel of claim 6, further comprising:
a first gate insulating layer, arranged between the layer where the first gate electrode is located and a layer where the oxide active layer is located;
a second gate insulating layer, arranged between the layer where the oxide active layer is located and a layer where the third gate electrode is located; and
an interlayer insulating layer, arranged between the layer where the oxide active layer is located and a layer where the second source electrode and the second drain electrode are located;
wherein the first source electrode and the first drain electrode are electrically connected with the poly-silicon active layer through a first via hole penetrating through the first gate insulating layer, the second gate insulating layer and the interlayer insulating layer;
the second source electrode and the second drain electrode are electrically connected with the oxide active layer through a second via hole penetrating through the second gate insulating layer and the interlayer insulating layer; and
the first via hole and the second via hole are formed in a same process.

8. The display panel of claim 6, wherein the base substrate further comprises:
a third area;
wherein the third area is not overlapped with either the first area or the second area; and
the third area is provided with a capacitor;
the capacitor comprises:
a first electrode, arranged in a same layer as the layer where the second gate electrode is located; and
a second electrode, arranged in a same layer as a layer where the third gate electrode is located.

9. The display panel of claim 6, further comprising:
a planarization layer,
a plurality of anodes, and
a pixel defining layer;
wherein the planarization layer, the plurality of anodes, and the pixel defining layer are arranged in sequence on a side, facing away from the base substrate, of the layer where the first source electrode and the first drain electrode are located;
the pixel defining layer is provided with a plurality of pixel openings, and each of the plurality of pixel openings is correspondingly internally provided with a respective one of the plurality of anodes; and
each of the plurality of anodes is correspondingly electrically connected with first drain electrode through a third via hole penetrating through the planarization layer.

10. The display panel of claim 6, wherein the oxide transistor is a switch transistor, and the low temperature poly-silicon transistor is a drive transistor.

11. A display device, comprising the display panel of claim 6.

12. The display device of claim 11, further comprising:
a first gate insulating layer, arranged between the layer where the first gate electrode is located and a layer where the oxide active layer is located;
a second gate insulating layer, arranged between the layer where the oxide active layer is located and a layer where the third gate electrode is located; and
an interlayer insulating layer, arranged between the layer where the oxide active layer is located and a layer where the second source electrode and the second drain electrode are located;
wherein the first source electrode and the first drain electrode are electrically connected with the poly-silicon active layer through a first via hole penetrating through the first gate insulating layer, the second gate insulating layer and the interlayer insulating layer;
the second source electrode and the second drain electrode are electrically connected with the oxide active layer through a second via hole penetrating through the second gate insulating layer and the interlayer insulating layer; and
the first via hole and the second via hole are formed in a same process.

13. The display device of claim 11, wherein the base substrate further comprises:
a third area;
wherein the third area is not overlapped with either the first area or the second area; and
the third area is provided with a capacitor;
the capacitor comprises:
a first electrode, arranged in a same layer as the layer where the second gate electrode is located; and
a second electrode, arranged in a same layer as a layer where the third gate electrode is located.

* * * * *